United States Patent
Ogure (10) Patent No.: US 6,486,413 B1
(45) Date of Patent: Nov. 26, 2002

(54) SUBSTRATE COATED WITH A CONDUCTIVE LAYER AND MANUFACTURING METHOD THEREOF

(75) Inventor: Naoaki Ogure, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/712,199

(22) Filed: Nov. 15, 2000

(30) Foreign Application Priority Data

Nov. 17, 1999 (JP) .......................................... 11-326736
Dec. 21, 1999 (JP) .......................................... 11-362971

(51) Int. Cl.$^7$ ................................................ H01R 9/09
(52) U.S. Cl. ........................ 174/261; 428/546; 428/548
(58) Field of Search .......................... 174/261; 428/546, 428/548

(56) References Cited

U.S. PATENT DOCUMENTS 5,679,466 A * 10/1997 Noguchi et al. ............. 428/551
6,083,340 A * 7/2000 Nomura et al. .............. 156/253
6,171,710 B1 * 1/2001 Ogino et al. ................. 428/559

* cited by examiner

Primary Examiner—Albert W. Paladini
(74) Attorney, Agent, or Firm—Browdy and Neimark

(57) ABSTRACT

A substrate is coated with a conductive layer, which comprises a conductive layer of bonded ultrafine metal particles formed on the top surface thereof. The ultra fine metal particles have a diameter of 1–20 nm, and the substrate is of a flexible high polymer material. Since the conductive layer is formed by bonded layer of the ultrafine metal particles, an extremely thin layer having high conductivity can be formed. This structure enables the formation of a flexible printed circuit board with high-density interconnects or a transparent conductive film provided with both transparency and conductivity. Conventional vacuum equipments and complicated processes are not necessary for forming the conductive layer on the substrate.

13 Claims, 7 Drawing Sheets

FIG. 6

SUBSTRATE COATED WITH A CONDUCTIVE LAYER AND MANUFACTURING METHOD THEREOF

BACKGROUND OF THE INVENTION

1. Field of the Invention

The present invention relates to a flexible printed circuit board having a substrate formed of plastic film or the like and coated with a conductive wiring layer. The present invention also relates to a substrate coated with a conductive layer, such as a transparent film having a transparent conductive layer or the like, and a manufacturing method thereof.

2. Description of the Related Art

Along with the recent increasing trend toward smaller, lighter, and thinner electronic equipment, there is more need for multipurpose flexible printed circuit boards made very thin and pliable. Conventional flexible printed circuit boards of this type have generally been constructed using polyester film or polyimide film as the substrate and copper leaf affixed to the surface of the substrate by adhesive.

Along with the increasingly high integration of semiconductor devices, however, there has been a strong demand for a low-cost flexible printed circuit board with closely packed interconnects between electronic devices incorporated in semiconductor devices. Therefore, studies have been made on methods for manufacturing reliable printed circuit boards to replace conventional techniques that use adhesives. One of these techniques employs ion plating or sputtering to deposit copper film directly on the surface of the substrate, such as plastic film. With this technique we can manufacture a flexible printed circuit board having strong adhesion without requiring adhesive. When manufacturing a printed circuit board using the cluster ion beam method to deposit copper onto the surface of polyimide film, for example, the technique achieves a precise pattern and great durability with sufficient adhesion strength and flexibility. The resulting product has a performance far superior to conventional printed circuit boards manufactured with adhesives.

However, a high volume production of flexible printed circuit boards by depositing thin copper film on the surface of a high polymer substrate using the ion beam method would require massive vacuum equipments. Such equipment would normally necessitate a high initial investment.

Transparent conductive film formed over transparent plastic film is widely used as an electrode layer in solar cells, display devices, photoelectric transducers, and the like. This conductive film has such electrical applications as transparent planar heating elements and anti electrostatic displays, and such optical applications as heat-rays shielding windows and selectively transmissive membranes for solar collectors and has functions that can be applied to a broad range of fields. Here, transparent conductive film is defined as the film hating both transparency and conductivity formed on the substrate of transparent high polymer resin, which is in essence an electrical insulator.

The above-mentioned transparent conductive film requires not only a combination of high conductivity with good transparency for visible rays, but also high reflectivity for infrared ways. Conductive film can be broadly classified as practical metal films and oxide films. Examples of the former include Au, Ag, Cu, Pd, Pt, Al, Cr, and Rh films, while those of the latter include $In_2O_3$, $SnO_2$, $Cd_2SnO_4$, and CdO films. Among these, silver (Ag) is enjoying increasing use as a selective conductive layer for electrode and the like to make use of its high electric conductivity.

When a thin gold film is used as a transparent conductive film, the sheet resistance of the conductive layer is $10-10^2$ $\Omega/\square$, with a high transparency of 70–80%. If, however, a polyester film were to be used as a substrate, adhesion would not be favorable. Therefore, a thin Pd film is used even though conductivity and transparency are slightly lower than those of Au film. In this case, when employing a transparent conductive film that uses thin metal film, the general practice is to form the thin metal film using sputtering deposition. As an examples of a transparent conductive film that uses an oxide semiconductor film, the sheet resistance of tin-doped indium oxide (indium tin oxide: ITO) film is approximately $10-10^5$ $\Omega/\square$, and the transparency, 80–88%. Although, the chemical stability of the material is slightly inferior to a $SnO_2$ film, this material is widely used, since the transparency and conductivity are both superior.

The vacuum deposition technique using indium oxide with a tin additive and the sputtering technique are employed in the formation of ITO film. Another film consists of a sandwich structure of a thin metal film interposed between oxide semiconductor films. This film, $TiO_2/Ag/TiO_2$, is known to have an excellent conductivity (sheet resistance of 1–10 $\Omega/\square$) and a high transparency of 75–85%. Namely, conductivity and transparency are both superb. In addition, high polymer electrolyte film has a low conductivity (sheet resistance of $10^6-10^{10}$ $\Omega/\square$, dependent on humidity) and a transparency of 80–85%.

This kind of transparent conductive film is produced by depositing thin transparent and conductive films on a high polymer base film serving as a substrate. This kind of conductive film is produced mainly using such conventional dry deposition techniques as vacuum deposition and reactive sputtering.

When using these conventional methods for covering plastic film with a layer of silver or other thin metal film to form transparent conductive film, it is necessary to keep the deposition temperature low mainly due to the limited heat resistance of the plastic film. Accordingly, both materials may have poor adhesion. A difference in the coefficient of thermal expansion of the two materials may develop thermal stress and distortion, which create adhesion problems. To avoid these problems, undercoat depositions and overcoat deposition are being regularly done as pre-treatments and post-treatments respectively in addition to the main deposition process. Under these conditions, however, the production process becomes more complicated. Moreover, forming films through vacuum deposition or sputtering inevitably requires special large vacuum equipments, which give rise to the problem of higher equipment costs.

SUMMARY OF THE INVENTION

In view of the foregoing, it is an object of the present invention to provide a flexible printed circuit board or a transparent substrate coated with a transparent conductive layer having high reliability and improved adhesion. It is another object of the present invention to provide a method for manufacturing the substrate coated with the conductive layer that does not employ adhesives or large, expensive vacuum equipments.

According to an aspect of the present invention, there is provided a substrate coated with a conductive layer, which comprises a substrate having a top surface; and a conductive layer of bonded ultrafine metal particles formed on the top surface of the substrate. It is desirable that the ultrafine metal particles have a diameter of 1–20 nm, and that the substrate is of a flexible high polymer material.

Since the conductive layer is formed by bonded layer of the ultrafine metal particles, an extremely thin layer having high conductivity can be formed. This structure enables the formation of a substrate coated with a conductive layer, such as a flexible printed circuit board with densely packed interconnects or a transparent conductive film provided with both transparency and conductivity. By selecting an appropriate combination of the ultrafine particle layer and the film for the substrate, the two materials are capable of mixing together along their bonding interface. In this structure, a portion of the ultrafine particles of silver or the like become embedded in the surface layer of the base film, forming strong adhesion between the metal layer and the base film.

According to another aspect of the present invention, a method for manufacturing the substrate coated with a conductive layer, comprises: preparing a substrate; preparing an ultrafine particle solution having ultrafine metal particles dispersed in a prescribed solvent; introducing the ultrafine particle solution onto a surface of the substrate; and bonding the ultrafine metal particles by drying the ultrafine particle solution introduced onto the surface of the substrate through subsequent heating process.

Since a strong bond is generated between the ultrafine metal particles and between the base film and the ultrafine metal particles at a relatively low temperature of 200–300° C. or less, a conductive layer having high conductivity and high adhesion can be formed on the plastic film or the like without generating problems with thermal stress and distortion that would be caused by higher temperatures. Since the solution employed in the above method contains dispersed ultrafine metal particles, a conductive layer can be formed on plastic film or the like by heating process conducted at a relatively low temperature and under atmospheric pressure. Accordingly, conventional vacuum equipments and complicated processes are not necessary for forming a conductive layer on the substrate.

The above and other objects, features, and advantages of the present invention will be apparent from the following description when taken in conjunction with the accompanying drawings, which illustrates preferred embodiments of the present invention by way of examples.

DETAILED DESCRIPTION OF THE PREFERRED EMBODIMENTS

The first embodiment of the present invention applies to a flexible printed circuit board employing ultrafine metal particles to form a conductive interconnects layer over a plastic film or the like.

Figure 1:
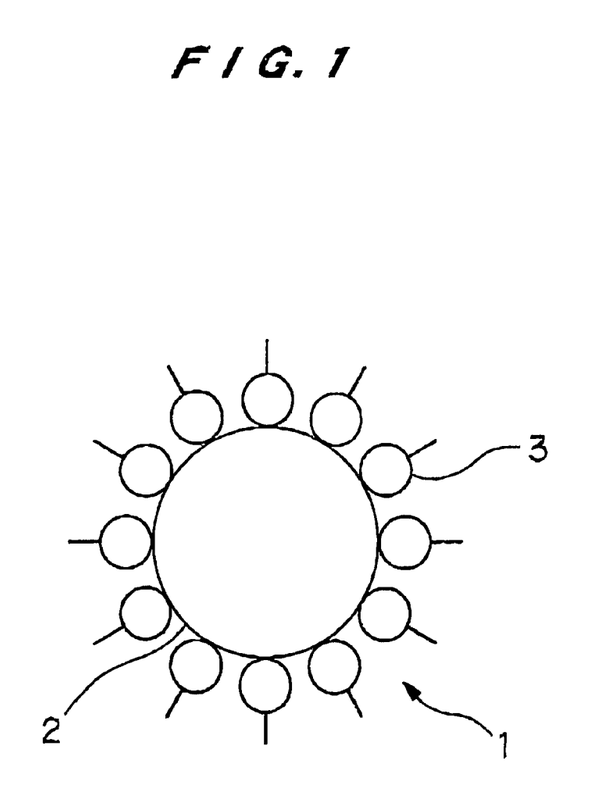
FIG. 1 is an explanatory diagram showing the structure of an ultrafine particle.

FIG. 1 is an explanatory diagram showing the structure of an ultrafine particle covered with an organic compound. Here, a complex ultrafine metal particle 1 comprises a core 2 formed essentially of a metal component and a coating 3 formed of an organic compound. The average particle size of the core 2 should be 1–20 nm and preferably about 1–10 nm.

Figure 2:
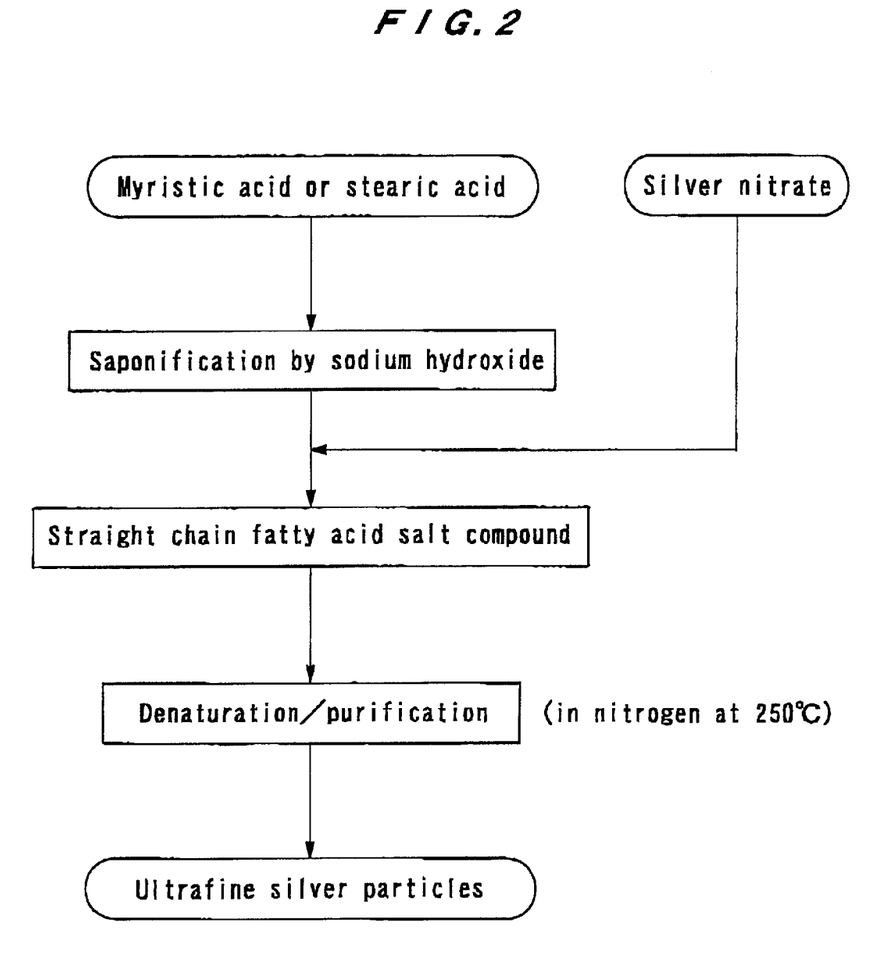
FIG. 2 is a flowchart showing the process for manufacturing ultra fine silver particles.

FIG. 2 is a flowchart showing a process for manufacturing ultra fine silver particles having an average diameter of about 5 nm. In this method, myristic acid or stearic acid, for example, undergoes saponification by sodium hydroxide and subsequently reacted with silver nitrate to produce a fatty acid salt (the number of carbon in the alkyl chain group=14, 18, 18ω) of a straight chain structure. This fatty acid salt is heated at about 250° C. in a nitrogen gas atmosphere for 4 hours for denaturation and purification, producing ultrafine silver particles coated with an alkyl chain shell.

Although not shown in the diagram, it is also possible to produce ultrafine silver particles covered with an ionic, organic matter by the following process. For example, silver nitrate (metallic salt) is heated for 3 hours at about 240° C., which is higher than the reduction and resolution temperature of the silver nitrate and lower than the decomposition temperature of the ionic, organic matter, while in a high-boiling temperature naphthenic solvent (nonaqueous solvent) and under the presence of oleic acid (the ionic, organic matter).

Ultrafine silver particles produced in this way are coated with the alkyl chain or the ionic, organic matter. Hence, when dissolving the particles in an organic solvent, such as cyclohexane, the particles do not agglomerate but mix uniformly and stably in the solvent in a state of transparency, that is, a solubilized state.

It is well known that the melting point of metal particles drops when the particle diameter becomes smaller. However, the phenomenon does not begin to appear until the particle diameter below 20 nm and is most remarkable at a particle size of 10 nm or less. Therefore, the average diameter of the ultrafine silver particles should be 1–20 nm and preferably 1–10 nm when employing extremely ultrafine silver particles of a minimal cluster level, having an average particle diameter of 5 nm. Such ultrafine silver particles can be melted and fused together under a temperature of about 200° C.

Figure 3:
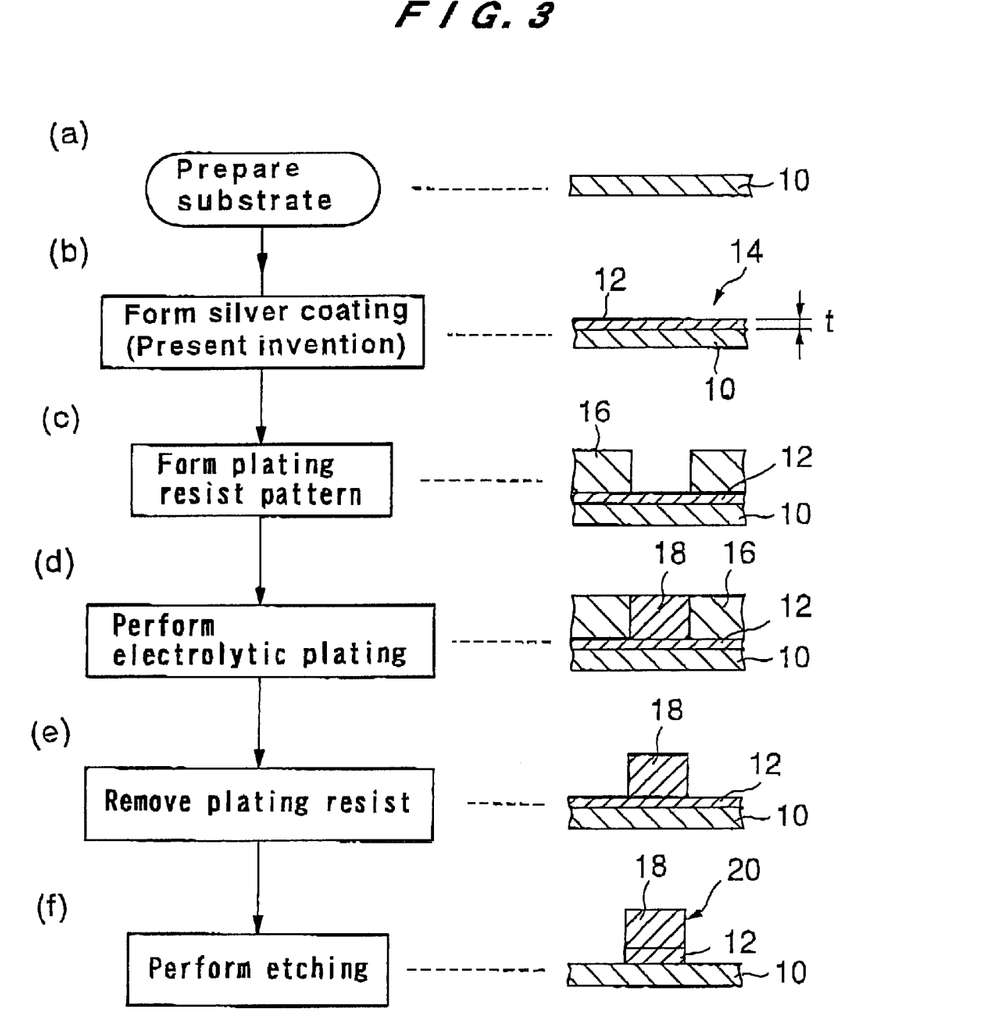
FIG. 3 is a flowchart showing the production process and state of a flexible printed circuit board according to the first embodiment.

FIG. 3 is a flowchart showing the production process of a conductive layer (interconnects layer) on a flexible printed circuit board using ultrafine silver particles manufactured as described referring in FIG. 2. As shown in FIG. 3(a), a film-like substrate 10 is prepared. The substrate 10 is formed of a thin polyester film or polyimide film having high flexibility. A silver coating layer 12 having a thickness t of 5 μm or less is coated on the surface of the substrate 10 in FIG. 3(b).

In this example, a circuit is manufactured on the substrate 10 using the semi-additive method well known in the art. As shown in FIG. 3(c), a plating resist pattern 16 is formed on the surface of the silver coating layer 12. Subsequently in FIG. 3(d), the channel area partitioned by the resist pattern 16 is filled with a filling material 18 of copper, silver, or the like using an electrolytic plating method, for example. In FIG. 3(e), the resist pattern 16 is removed. In FIG. 3(f), the unnecessary silver coating layer 12 is removed through etching, leaving a patterned metal layer 20 formed of the interconnect material 18 deposited on the silver coating layer 12.

Figure 4:
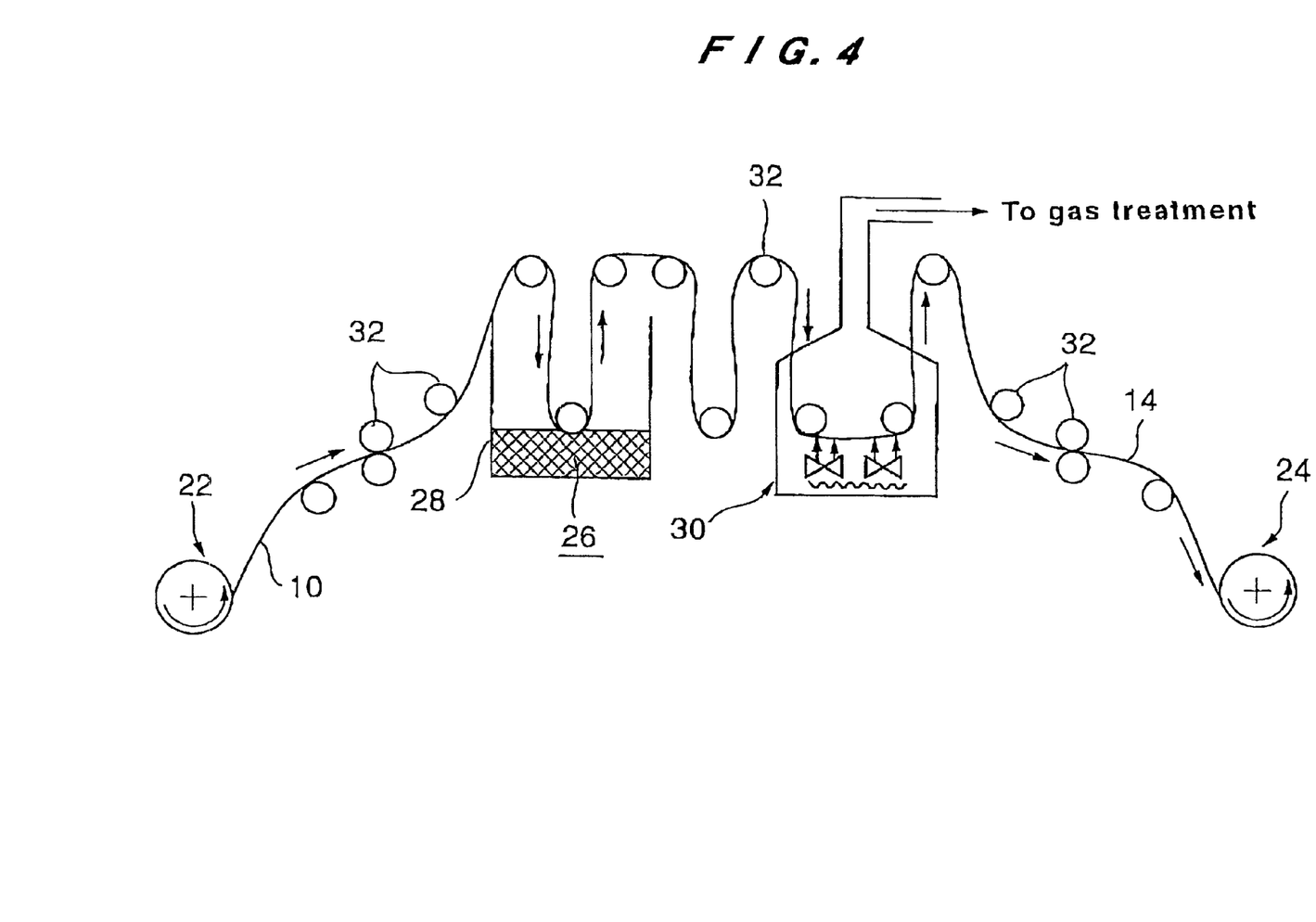
FIG. 4 is an explanatory diagram showing the general construction of an apparatus used to manufacture the printed circuit board of FIG. 3.

FIG. 4 is an explanatory diagram showing an apparatus suitable for continuously coating the silver layer 12 onto the substrate 10. The apparatus includes a pay-out roll 22 for gradually letting out the film-like substrate 10 shown in FIG. 3(a) from a roll and a take-up roll 24 for gradually taking in and rolling up the substrate 10 after the surface of the substrate 10 has been coated with the silver layer 12. Between the pay-out roll 22 and take-up roll 24, the apparatus includes a storage tank 28 storing an ultrafine silver particle solution 26, and a drying chamber 30 for drying the ultrafine silver particle solution 26 coated on the surface of the substrate 10 through heating process The substrate 10 pulled of f of the pay-out roll 22 is guided by a plurality of guide rollers 32 into the storage tank 28 and subsequently the drying chamber 30. During this process, the silver coating layer 12 is formed on the substrate 10, and the coated end of the substrate 10 is wound up by the take-up roll 24.

The ultrafine silver particle solution 26 includes the ultrafine silver particles having a diameter of approximately 5 nm dispersed in an appropriate organic solvent, such as cyclohexane. The concentration of the solvent can be freely adjusted to attain a desirable viscosity.

Secondly, an example of forming a silver coating layer with this apparatus will be described.

To begin with, the substrate 10 is pulled off of the pay-out roll 22 and guided into the storage tank 28. In the storage tank 28, the substrate 10 is dipped in the ultrafine silver particle solution 26 accommodated therein to deposit the ultrafine silver particle solution 26 on the surface of the substrate 10. Subsequently, the substrate 10 now coated with the ultrafine silver particle solution 26 is introduced into the drying chamber 30.

The drying chamber 30 heats the substrate 10 up to an elevated temperature or the like of about 200° C., or a temperature equal to or greater than the decomposition temperatures of the alkyl chain and ionic, organic matter covering the ultrafine silver particles and maintains this temperature while the substrate 10 passes through the drying chamber 30. In this way, the drying chamber 30 dries the ultrafine silver particle solution 26 coated on the substrate 10 through the heating process, causing the solvent to vaporize and forming the silver coating layer 12 comprising a thin layer of silver on the surface of the substrate 10. At the same time, the alkyl chain and ionic, organic matter covering the ultrafine silver particles decompose and disappears, the particles are fused together and closely adhered to the substrate 10. This process forms a silver coating layer 12 into a uniform layer insisting of the ultrafine silver particles that is closely adhered to the surface of the substrate 10. After its surface is coated with the silver layer 12, the substrate 10 is wound up continuously by the take-up roll 24. Here, the amount of time required to dry the ultrafine silver particle solution 26 coated on the surface of the substrate 10 and to reduce the solution to a silver film is calculated. Then the conveying velocity of the substrate 10 is set to ensure that the ultrafine silver particle solution 26 deposited on the surface of the substrate 10 remains in the drying chamber 30 for the required period of time.

The maximum thickness of the silver coating layer 12 that can be formed in each process of depositing and drying the ultrafine silver particle solution 26 is 0.1–0.2 $\mu$m. Therefore, if a thicker silver coating layer 12 is required, the dipping and drying process cycle must be repeated multiple times. In this case, a storage tank accommodating the ultrafine silver particle solution is provided on each side of the drying chamber, and the cycle can be performed by repeatedly driving the rollers in the forward and reverse directions. Or, the same apparatus shown in FIG. 4 can be used by exchanging the take-up roll 24 with the pay-out roll 22 after performing one process and by repeating the same process.

The strength where the silver coating layer 12 bonds the substrate 10 is verified by a peel test using ordinary adhesive tape. When manufacturing interconnect layer using the method shown in FIG. 3, it is possible to form a minimum interconnect width of 0.5 $\mu$m. This value sufficiently satisfies the standard requirements for today's printed circuit boards.

The entire process of this method for manufacturing a flexible printed circuit board 14 formed with fine patterned interconnects can be performed at normal room temperature and under atmospheric pressure, except for the step using the drying chamber 30 at a temperature of 200–300° C. Morever, by using this invention, the equipment expense is extremely low. Hence, from a cost-effectiveness perspective, the present invention can supply competitive flexible printed circuit boards.

The adhesive capability of the silver coating on the substrate is further increased by employing the ultrafine silver particle solution that is premixed with a high polymer compound that is highly reactive to the substrate mixed in the organic solvent described above. In this example, the substrate is dipped in the ultrafine silver particle solution. However, the ultrafine silver particle solution can be applied to the substrate or put in contact with the substrate by such methods as pouring, painting, or spraying.

A second embodiment of the present invention will be described with reference to FIGS. 5 through 7. The second embodiment applies to a transparent conductive substrate, wherein ultrafine metal particles are used to form a transparent conductive layer on a transparent plastic film.

As in the first embodiment, the particle diameter of the ultrafine metal particles should be 1–20 nm and preferably 1–10 nm. Ideally, the particles should be ultraf ine silver particles having an average particle diameter of approximately 5 nm and covered with an alkyl chain or an ionic organic compound and dissolved in an organic solvent such as cyclohexane. The particles are mixed uniformly in the solvent in a steady solubilized state and do not agglomerate.

Figure 5:
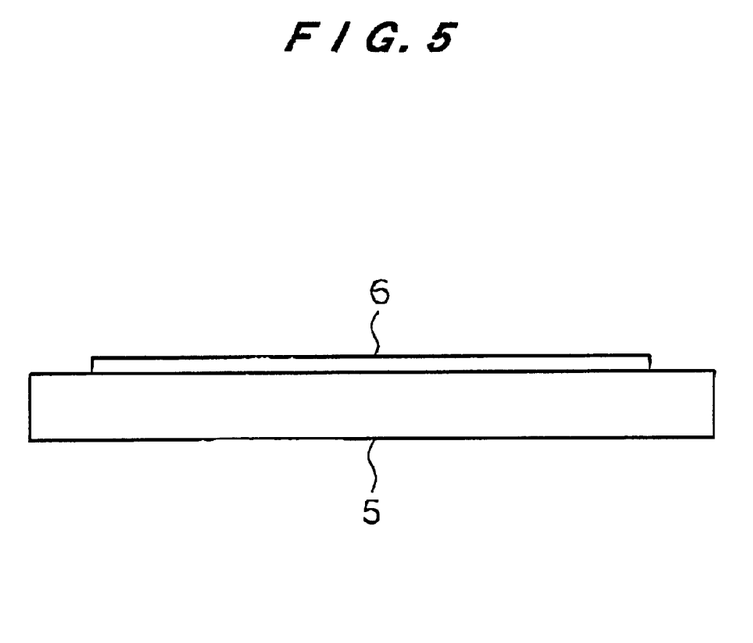
FIG. 5 is an explanatory diagram showing a transparent conductive layer formed on a transparent substrate according to the second embodiment.
Figure 6:
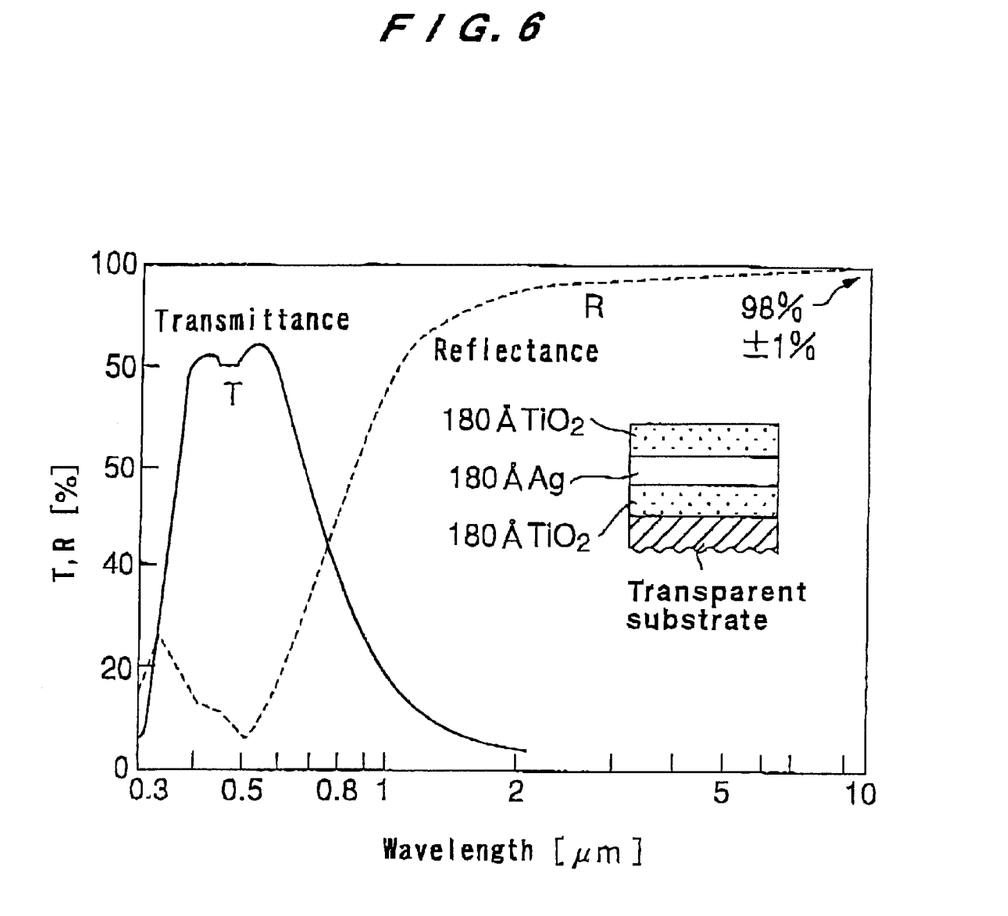
FIG. 6 is a graph showing the structure and optical characteristics of a printed circuit board having an Ag layer interposed between top and bottom $TiO_2$ layers.

As shown in FIG. 5, the above solution is applied to transparent plastic film 5 formed of polyester. The transparent plastic film 5 is baked at 200° C. for approximately 30 min, for example, causing the solution to vaporize and the silver particles to melt together and form a thin solid film 6 on the plastic film. Since the ultrafine particles have a special property of melting at a far lower temperature than the normal melting point of silver, ultrafine silver particles having a diameter of approximately 5 nm will sufficiently melt at about 200° C. and fuse together to form a conductive layer.

According to this method, the particle size and the compounding ratio are adjusted when mixing the ultrafine silver particles in the solvent, such that the silver film formed on the plastic film can be maintained at a thickness within a range (less than about 20 nm) in which transparency can be maintained. Generally, the conductivity of a transparent conductive layer rises in proportion to the thickness. However, transparency has an inverse relation to thickness. That is, the degree of opaqueness increases as the thickness increases. The degree of change varies according to the film material. In other words, conductivity and transparency have reciprocal relations to thickness. Hence, it is necessary to select an optimal layer thickness to suit the material of the transparent conductive layer and conditions for its use. When metal is set at a thickness of 20 nm or less, light absorption and reflectance both decrease while transparency increases, revealing its properties as a transparent conductive layer. Based on the tradeoff between conductivity and transparency described above, the practical thickness for the transparent conductive layer should be 3–15 nm.

By selecting an appropriate combination of the plastic film and solvent, the two substances will mix together during the drying process, as the surface portion of the plastic film becomes softened by the solvent (elution). Since some of the ultrafine silver particles enter into the surface layer of the plastic film, the topmost layer of the plastic film and the formed silver layer are integrally formed, providing extremely strong adhesion between the two. Accordingly, it is possible to avoid problems with conventional methods caused mainly by low adhesive strength that have frequently been observed. Hence, by employing a combination of plastic film and solvent, in which the solvent can elute a portion of the surface on the plastic film, the ultrafine silver particles can become embedded in the surface of the plastic film after the heating process, forming an integral bond.

The solvent can also be formed by mixing thermoplastic adhesive in the solvent and dispersing the ultrafine silver particles in this mixture. By applying this solution to the plastic film and heating the film, the adhesive bonds the plastic film, and the silver particles as a single integral unit. As a result, a portion of the ultrafine silver particles becomes embedded in the plastic film, thereby attaining a thin silver layer with superior adhesion for forming a strong bond with the plastic film.

In this example, the plastic film is manufactured from polyester. Polyester is manufactured from polyethylene terphthalate (PET), which is obtained through the polycondensation of terphthalic acid and ethylene glycol. PET is formed into a film shape through a process of heating and stretching. Accordingly, adhesive used for PET film can be applied here. There are currently various PET film adhesives sold commercially, such as the products S-400, S-424, S-550, and S-430 having the primary component of polyester, manufactured by Teru chemical industry Co.Ltd.

It is also possible to form other layers in addition to the silver layer. As described above, for example, when forming a sandwich structure having a silver layer interposed between a top and bottom layer of $TiO_2$, optimal selective transparency is achieved. This sandwich structure can be formed by depositing a silver layer according to the present invention and subsequently forming the $TiO_2$ layers by exposing the silver layer in an organic gas containing Ti for a fixed period of time. This sandwich structure and the optical properties thereof are shown in FIG. 6.

Figure 7:
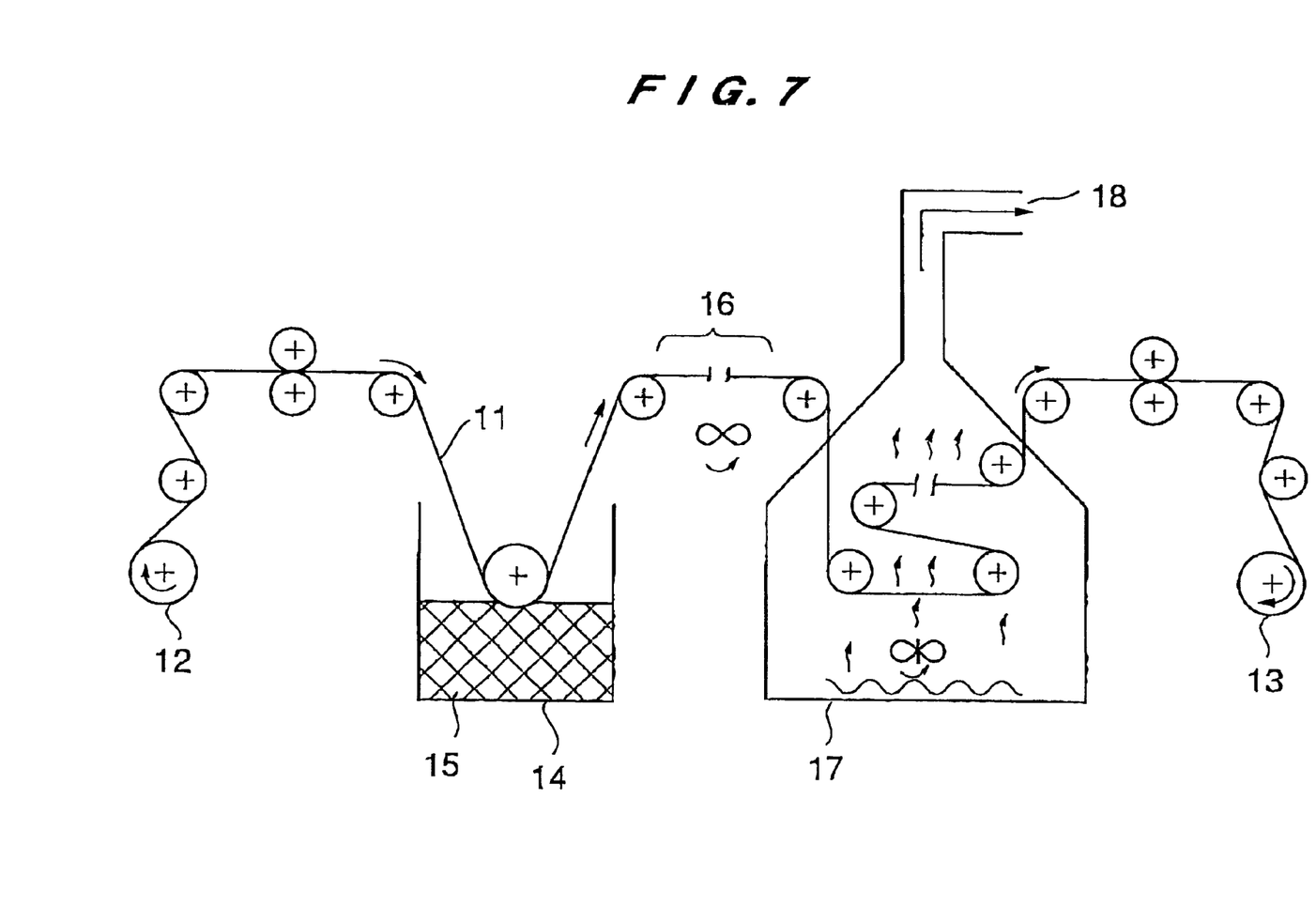
FIG. 7 is an explanatory diagram showing the general construction of an apparatus used to manufacture the transparent substrate having a transparent conductive layer of FIG. 5.

FIG. 7 is an explanatory diagram showing the structure of an apparatus for manufacturing a transparent conductor substrate according to the second embodiment. A transparent plastic film 11 is unwound from a pay-out roller 12 and wound up by a take-in roller 13. With this configuration, the transparent plastic film 11 travels continuously along a prescribed conveying path. The transparent plastic film 11 unwound from the pay-out roller 12 is conveyed such that one surface of the transparent plastic film 11 contacts the solution 15 accommodated in an application tank 14. The solution 15 includes ultrafine silver particles having an average diameter of approximately 5 nm uniformly dispersed in the solution. When necessary, thermoplastic adhesive can be mixed in the solution 15.

After receiving a coating layer of the solution 15, the transparent plastic film 11 is dried by a drying section 16 comprising a fan. Subsequently, the transparent plastic film 11 is conveyed into a baking chamber 17 and kept at a temperature of approximately 200° C. for about 30 min. In the baking process, the solvent and the organic matter on the plastic film are vaporized, while the ultrafine silver particles melt and fuse together to form a thin film on the transparent plastic film 11. The film is extremely thin and therefore transparent, achieving the transparent conductive layer. An exhaust port 18 is provided on the top of the baking chamber 17 for providing local exhaust. Following the baking process, the transparent plastic film 11 is wound up by the take-in roller 13. The transparent plastic film 11 manufactured in this way, is subsequently cut into prescribed dimensions and used for various applications as a transparent conductive substrate comprising a transparent conductive layer on a transparent substrate. When it is necessary to selectively provide electrode patterns and the like in a transparent conductive layer, it is possible to form a resist pattern to remove unnecessary portions.

Since there is a considerable difference between the time required for applying the solution 15 and the time required for drying and baking, it is necessary to incorporate a mechanism capable of adjusting the lapsed time in the drying section 16 and the baking chamber 17. In some cases, the drying device in the above construction can be eliminated.

Since special vacuum process chambers are unnecessary in the apparatus for manufacturing this transparent substrate having thin transparent conductive layer thereon, the apparatus of the present invention is much less expensive than conventional manufacturing apparatus using vacuum deposition and sputtering techniques. Further, the apparatus achieves high productivity, being capable of manufacturing transparent substrate having thin transparent conductive layer thereon continuously.

Although certain preferred embodiments of the present invention have been shown and described in detail, it should be understood that various changes and modifications may be made therein without departing from the scope of the appended claims.

What is claimed is:

1. A substrate coated with a conductive layer, comprising;
   a substrate having a top surface; and
   a conductive layer of bonded ultrafine metal particles formed on the top surface of the substrate;
   wherein said ultrafine metal particles comprise a thermal decomposition product of an organic complex or a metallic salt comprising a silver complex or a silver salt.

2. A substrate coated with a conductive layer as claimed in claim 1, wherein the ultrafine metal particles have a diameter of 1–20 nm.

3. The coated substrate of claim 2, wherein the ultrafine metal particles have a diameter of 1–10 nm.

4. The coated substrate of claim 3, wherein said ultrafine metal particles are silver particles having an average particle diameter of approximately 5 nm.

5. A substrate coated with a conductive layer as claimed in claim 1, wherein the substrate is of a flexible high polymer material.

6. A substrate coated with a conductive layer as claimed in claim 1, wherein the substrate is transparent.

7. A substrate coated with a conductive layer as claimed in claim 1, wherein the conductive layer is a metal layer formed by contacting the surface of the substrate with a solution comprising ultrafine metal particles dispersed in a prescribed solvent and subsequently drying the solution contacting the substrate through heating process.

8. A substrate coated with a conductive layer as claimed in claim 1, wherein the substrate is a flexible film having printed circuit interconnects thereon.

9. A substrate coated with a conductive layer as claimed in claim 1, wherein the substrate is transparent film having a transparent conductive layer thereon.

10. A substrate coated with a conductive layer as claimed in claim 9, wherein the thickness of the conductive layer is 20 nm or less.

11. The coated substrate of claim 10, wherein the thickness of said transparent conductive layer is 3–15 nm.

12. A substrate coated with a conductive layer as claimed in claim 1, wherein the ultrafine metal particles consist essentially of ultrafine silver particles.

13. The coated substrate of claim 1, wherein a portion of said ultrafine particles are embedded in the top surface of said substrate.

* * * * *